(12) United States Patent
Shioji

(10) Patent No.: US 10,355,178 B2
(45) Date of Patent: Jul. 16, 2019

(54) LIGHT-EMITTING DEVICE AND METHOD FOR MANUFACTURING THE SAME

(71) Applicant: NICHIA CORPORATION, Anan-shi, Tokushima (JP)

(72) Inventor: Shuji Shioji, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/043,102

(22) Filed: Jul. 23, 2018

(65) Prior Publication Data
US 2019/0027657 A1 Jan. 24, 2019

(30) Foreign Application Priority Data
Jul. 24, 2017 (JP) .................................. 2017-143072

(51) Int. Cl.
| H01L 33/50 | (2010.01) |
| H01L 33/56 | (2010.01) |
| F21V 19/00 | (2006.01) |
| H01L 33/36 | (2010.01) |
| H01L 33/62 | (2010.01) |

(52) U.S. Cl.
CPC .......... H01L 33/504 (2013.01); F21V 19/001 (2013.01); H01L 33/36 (2013.01); H01L 33/62 (2013.01)

(58) Field of Classification Search
CPC ..... H01L 33/504; H01L 33/502; H01L 33/56; H01L 33/58; H01L 2933/0041; C09K 11/025
See application file for complete search history.

(56) References Cited

U.S. PATENT DOCUMENTS

| 7,342,357 B2 * | 3/2008 | Sakano | B29C 67/08 313/512 |
| 2006/0220046 A1 * | 10/2006 | Yu | G02B 6/0016 257/98 |
| 2006/0267042 A1 * | 11/2006 | Izuno | H01L 21/76251 257/100 |

(Continued)

FOREIGN PATENT DOCUMENTS

| JP | 2010251621 A | 11/2010 |
| JP | 2011222718 A | 11/2011 |

(Continued)

*Primary Examiner* — Earl N Taylor
(74) *Attorney, Agent, or Firm* — Hunton Andrews Kurth LLP

(57) ABSTRACT

A light-emitting device includes a light-emitting element and a light-transmissive member containing a phosphor, particles, and a matrix, the phosphor and the particles being dispersed in the matrix, the particles including at least one of surface-treated particles, particles coexisting with a dispersing agent, and surface-treated particles coexisting with a dispersing agent, the particles being dispersed as aggregates, the particles having an average particle diameter in a range of 1 nm to 8 nm, a content of the particles falling within a range of 0.01 parts by mass to less than 5 parts by mass relative to 100 parts by mass of the matrix, a content of the phosphor falling within a range of 100 parts by mass to 300 parts by mass relative to 100 parts by mass of the matrix.

6 Claims, 3 Drawing Sheets

(56) References Cited

U.S. PATENT DOCUMENTS

| | | | |
|---|---|---|---|
| 2008/0231170 A1* | 9/2008 | Masato | C09K 11/565 |
| | | | 313/501 |
| 2009/0045422 A1* | 2/2009 | Kato | C09D 183/04 |
| | | | 257/98 |
| 2009/0066230 A1* | 3/2009 | Hirosaki | C01B 21/0602 |
| | | | 313/504 |
| 2010/0164365 A1* | 7/2010 | Yoshino | C09K 11/7734 |
| | | | 313/503 |
| 2010/0200874 A1* | 8/2010 | Shioi | C09K 11/0883 |
| | | | 257/91 |
| 2010/0237370 A1* | 9/2010 | Kim | H01L 33/504 |
| | | | 257/98 |
| 2011/0182072 A1* | 7/2011 | Shimizu | C09K 11/7739 |
| | | | 362/293 |
| 2011/0210354 A1* | 9/2011 | Ichikawa | B29C 45/0055 |
| | | | 257/98 |
| 2012/0019123 A1* | 1/2012 | Furukawa | H01L 33/54 |
| | | | 313/483 |
| 2012/0119234 A1* | 5/2012 | Shioi | H01L 33/502 |
| | | | 257/88 |
| 2012/0161621 A1* | 6/2012 | Sato | H01L 33/54 |
| | | | 313/512 |
| 2012/0217526 A1* | 8/2012 | Kumura | H01L 33/486 |
| | | | 257/98 |
| 2013/0125365 A1* | 5/2013 | Goto | C08G 77/395 |
| | | | 29/428 |
| 2015/0021643 A1* | 1/2015 | Kurino | C01G 23/0536 |
| | | | 257/98 |
| 2015/0162509 A1* | 6/2015 | Kuramoto | H01L 33/50 |
| | | | 257/98 |
| 2017/0062668 A1* | 3/2017 | Yoshimura | H01L 33/504 |
| 2017/0130126 A1* | 5/2017 | Wakui | C09K 11/7734 |
| 2017/0331016 A1* | 11/2017 | Tchoul | H01L 33/507 |
| 2018/0072948 A9* | 3/2018 | Wakui | C09K 11/7734 |
| 2018/0162974 A1* | 6/2018 | Sugiyama | C08F 14/18 |
| 2019/0002719 A1* | 1/2019 | Pousthomis | B01J 13/043 |
| 2019/0002759 A1* | 1/2019 | D'Amico | C09K 11/06 |
| 2019/0027657 A1* | 1/2019 | Shioji | H01L 33/504 |

FOREIGN PATENT DOCUMENTS

| | | |
|---|---|---|
| JP | 2014031436 | 2/2014 |
| JP | 2015109354 A | 6/2015 |
| JP | 2016082212 A | 5/2016 |

* cited by examiner

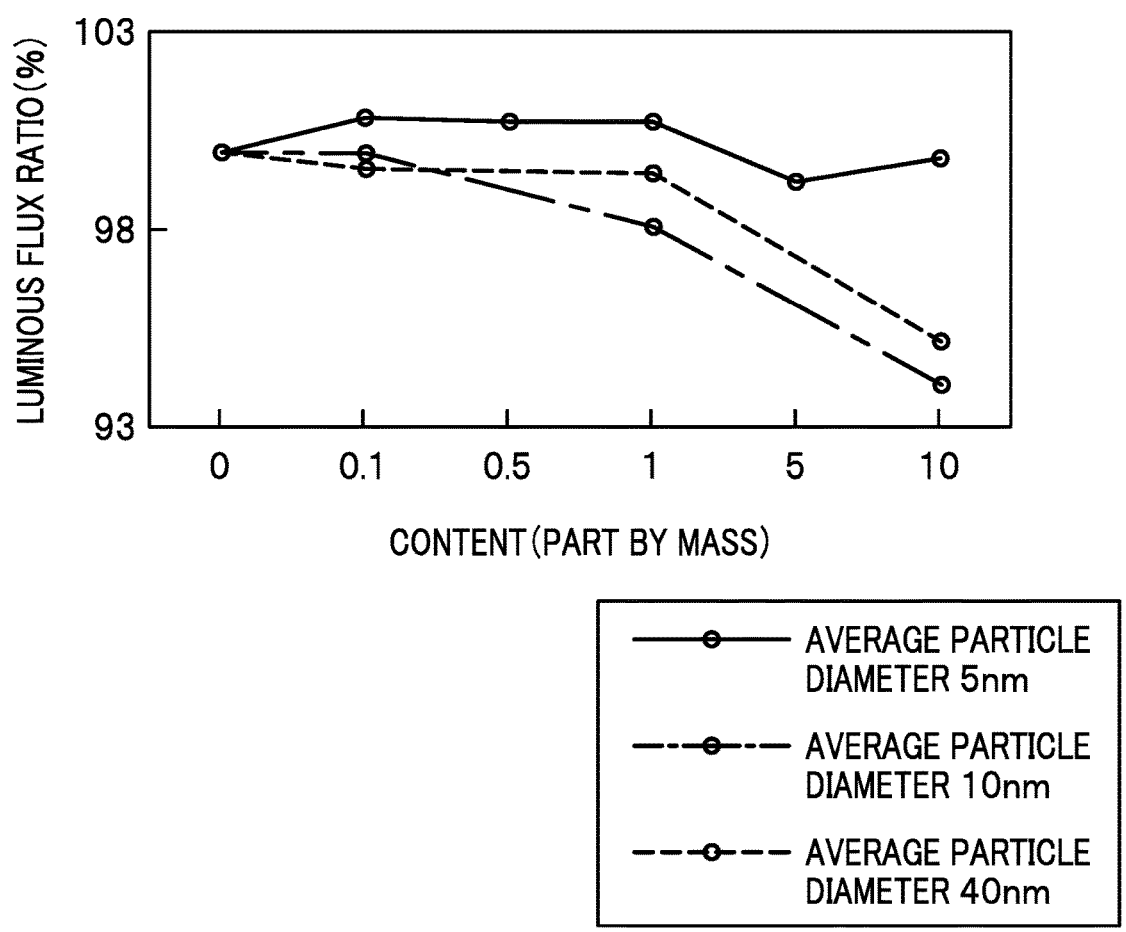

LIGHT-EMITTING DEVICE AND METHOD FOR MANUFACTURING THE SAME

CROSS-REFERENCE TO RELATED APPLICATIONS

The present application claims priority under 35 U.S.C. § 119 to Japanese Patent Application No. 2017-143072, filed Jul. 24, 2017, the contents of which are hereby incorporated by reference in their entirety.

BACKGROUND OF THE INVENTION

1. Field of the Invention

The disclosure of the present invention relates to a light-emitting device and a method for manufacturing the same.

2. Description of Related Art

Light-emitting devices manufactured by disposing light-emitting elements in depressed portions of packages, connecting the light-emitting elements to lead frames with wires, and charging and curing encapsulating resins are conventionally known (for example, see Japanese Unexamined Patent Application Publication No. 2011-222718).

SUMMARY OF THE INVENTION

A light-emitting device according to an embodiment of the present disclosure includes a light-emitting element and a light-transmissive member covering the light-emitting element, the light-transmissive member containing a phosphor, particles, and a matrix, the phosphor and the particles being dispersed in the matrix, the particles including at least one of surface-treated particles, particles coexisting with a dispersing agent, and surface-treated particles coexisting with a dispersing agent, the particles being dispersed as aggregates, the particles having an average particle diameter in a range of 1 nm to 8 nm, a content of the particles falling within a range of 0.01 parts by mass to less than 5 parts by mass relative to 100 parts by mass of the matrix, a content of the phosphor falling within a range of 100 parts by mass to 300 parts by mass relative to 100 parts by mass of the matrix.

A method for manufacturing a light-emitting device according to an embodiment of the present disclosure includes mounting a light-emitting element in a depressed portion of a substrate and forming a light-transmissive member in the depressed portion to cover the light-emitting element, the light-transmissive member containing a phosphor; at least one of surface-treated particles, particles coexisting with a dispersing agent, and surface-treated particles coexisting with a dispersing agent; and a matrix, the phosphor and the particles being dispersed in the matrix, the particles being dispersed as aggregates, the particles having an average particle diameter in a range of 1 nm to 8 nm, a content of the particles falling within a range of 0.01 parts by mass to less than 5 parts by mass relative to 100 parts by mass of the matrix, a content of the phosphor falling within a range of 100 parts by mass to 300 parts by mass relative to 100 parts by mass of the matrix in the forming of the light-transmissive member.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 4 is a graph showing the relation between the luminous flux ratio and the average particle diameter and content of zirconium oxide particles of the light-emitting device according to the present embodiment.

DETAILED DESCRIPTION OF EMBODIMENTS

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

Figure 1:
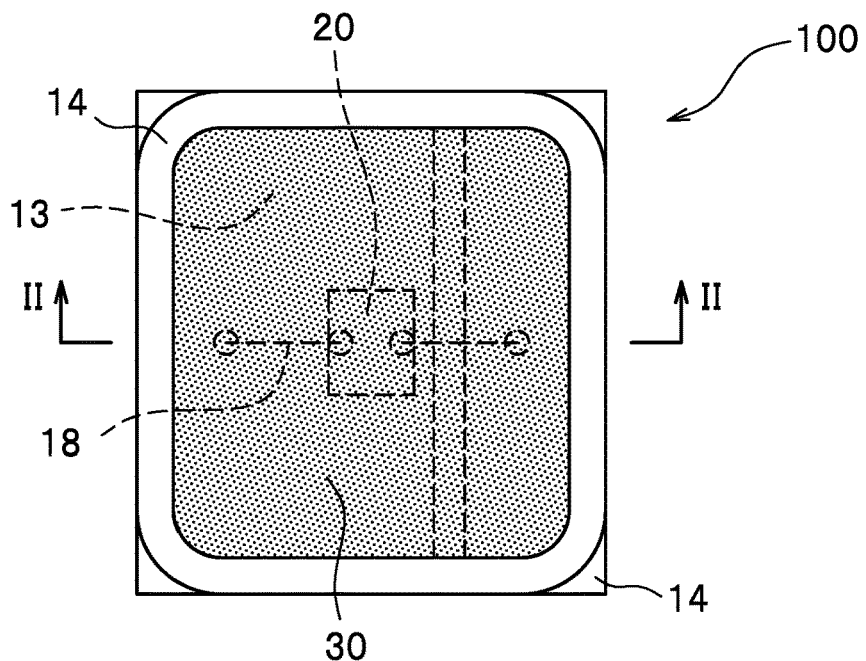
FIG. 1 is a schematic top view of a light-emitting device according to a present embodiment.
Figure 2:
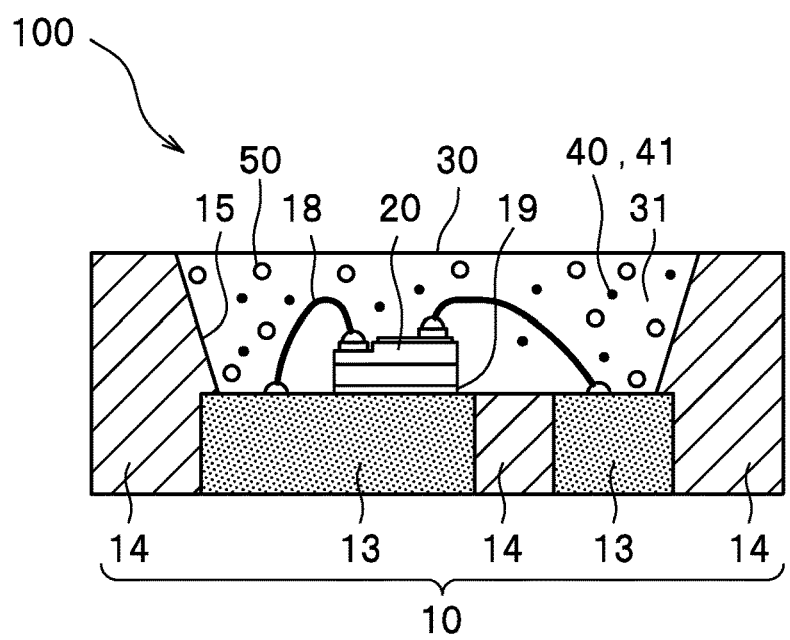
FIG. 2 is a schematic cross-sectional view taken along the line II-II in FIG. 1.
Figure 3:
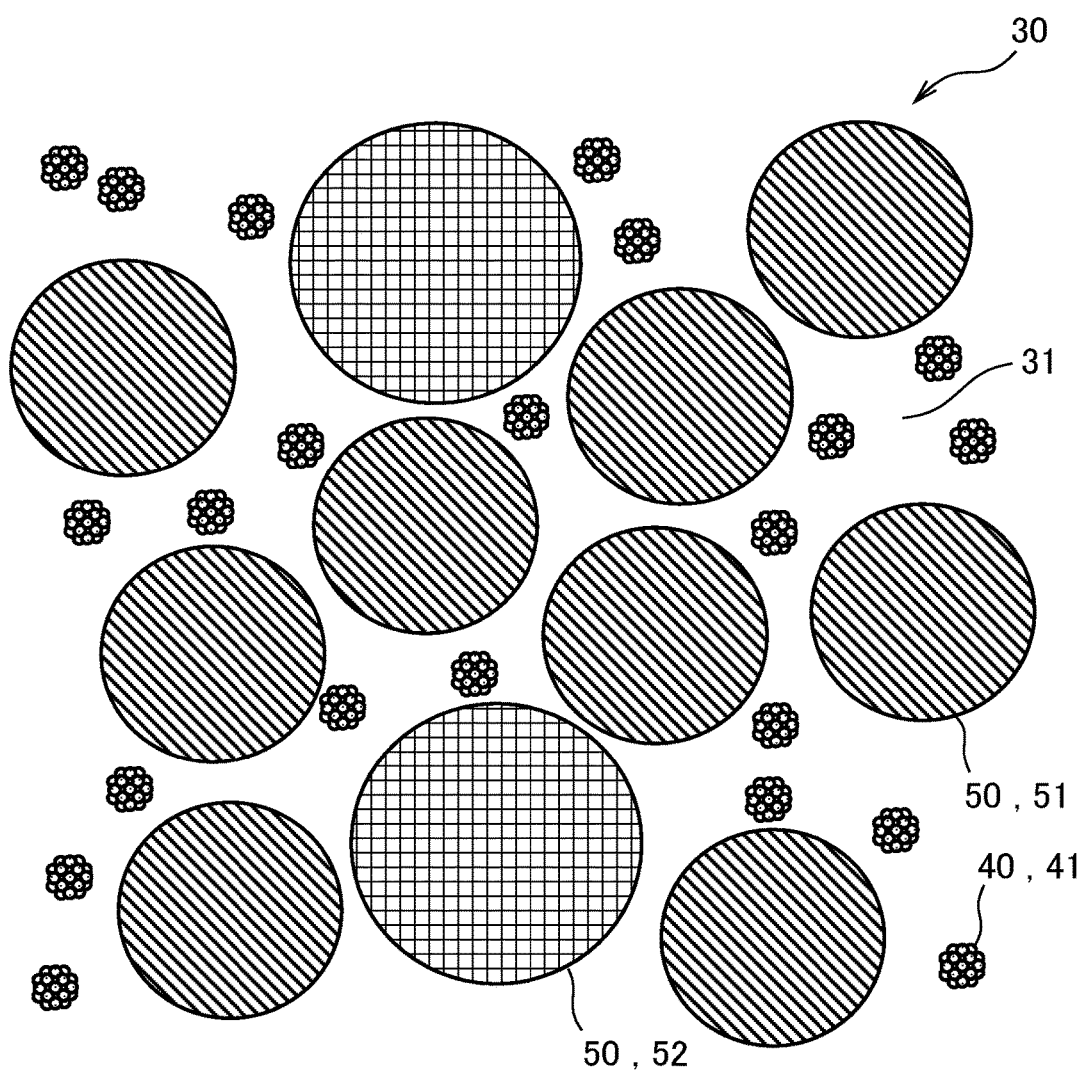
FIG. 3 is a diagram schematically illustrating how a phosphor and aggregated particles exist in a light-transmissive member according to the present embodiment.

FIG. 1 is a schematic top view of a light-emitting device according to the present embodiment. FIG. 2 is a schematic cross-sectional view taken along the line II-II in FIG. 1. FIG. 3 is a diagram schematically illustrating how a phosphor and aggregated particles exist in a light-transmissive member according to the present embodiment.

As shown in FIG. 1 and FIG. 2, a light-emitting device 100 includes a light-emitting element 20 and a light-transmissive member 30. The light-emitting device 100 is, for example, a surface-mount light-emitting diode (LED) and includes a substrate 10 having a depressed portion 15, the light-emitting element 20 accommodated in the depressed portion 15, and the light-transmissive member 30 formed in the depressed portion 15 to cover the light-emitting element 20. The following describes the components of the light-emitting device according to the present invention.

Substrate 10

The substrate 10 is a member serving as a housing or pedestal in which the light-emitting element 20 is mounted. The substrate 10 includes, as main components, electrically-conductive members 13 electrically connected to the light-emitting element 20 and a formed body 14 supporting the electrically-conductive members 13. The substrate 10 may be in the form of a package or a circuit board. Specific examples of the substrate 10 include a resin formed body integrated with a lead frame by transfer molding or injection molding as well as a sintered product of layered ceramic green sheets on which an electrically-conductive paste has been printed. It is preferable that the periphery of the upper surface of the substrate 10 be substantially flat, but the periphery may be curved. The depressed portion 15 is formed at the center of the upper surface of the substrate 10. The depressed portion 15 may be formed by causing the formed body 14 itself to cave in or by separately forming a frame-shaped protrusion on the upper surface of a substantially flat formed body 14 so that the inside of the projection serves as the depressed portion 15. Examples of the shape of the depressed portion 15 in a top view include circles, ellipses, rectangles, and rectangles with rounded corners. The lateral walls of the depressed portion 15 are preferably inclined such that the diameter of the depressed portion 15 increases from the bottom surface toward the upper side of the depressed portion 15 in order to help the formed body 14 release from a mold and to efficiently extract light from the light-emitting element 20. The inclination includes a curve. The inclination angle of a lateral wall of the depressed portion 15 is, for example, in the range of 95° to 120° from the bottom surface of the depressed portion 15. The depth of the depressed portion 15 is not particularly limited but is, for example, in the range of 0.05 mm to 2 mm, preferably 0.1 mm to 1 mm, more preferably 0.25 mm to 0.5 mm.

Electrically-Conductive Members 13

The electrically-conductive members 13 are part of a lead frame formed of a metal member that is connected to the light-emitting element 20 and can conduct electricity. Specific examples include a pair of positive and negative lead electrodes and wiring formed of gold, silver, copper, iron, aluminum, tungsten, cobalt, molybdenum, chromium, titanium, nickel, palladium, an alloy of these materials, phosphor bronze, or a copper-iron alloy. Plating or a light-reflective film made of silver, aluminum, rhodium, gold, copper, or an alloy of these materials may be disposed on the outer layer of the electrically-conductive members 13. Among these materials, silver, which has the best light-reflecting property, is preferable. The electrically-conductive members 13 are exposed on the back surface of the substrate 10 and also function as heat dissipating members.

Formed Body 14

The formed body 14 is electrically insulative and supports the electrically-conductive members 13. Examples of the matrix of the formed body 14 include thermoplastic resins such as alicyclic polyamide resins, semi-aromatic polyamide resins, poly ethylene terephthalate, poly cyclohexane terephthalate, liquid crystal polymers, polycarbonate resins, syndiotactic polystyrene, polyphenylene ethers, polyphenylene sulfide, polyether sulfone resins, polyether-ketone resins, and polyarylate resins, and thermosetting resins such as polybismaleimide-triazine resins, epoxy resins, modified epoxy resins, silicone resins, modified silicone resins, polyimide resins, and polyurethane resins. Such a matrix can be mixed with, as a filler or color pigment, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, or carbon black. In addition, the formed body 14 may be formed of a ceramic containing aluminum oxide, aluminum nitride, or a mixture of these materials.

Light-Emitting Element 20

A semiconductor light-emitting element such as light-emitting diode (LED) elements can be used for the light-emitting element 20. The light-emitting element 20 is bonded to the bottom surface of the depressed portion 15 of the substrate 10 with an adhesive 19 and is electrically connected to the electrically-conductive members 13 with wires 18. The light-emitting element 20 is only required to include an element structure made of any of various semiconductors provided with a pair of positive and negative electrodes. In particular, the light-emitting element 20 preferably includes a nitride semiconductor ($In_xAl_yGa_{1-x-y}N$, $0 \leq x$, $0 \leq y$, $x+y \leq 1$) that can efficiently excite a phosphor 50. The light-emitting element 20 preferably has an emission peak in the range of 400 nm to 480 nm. Alternatively, a gallium-arsenide or gallium-phosphide semiconductor light-emitting element may be employed. One or a plurality of light-emitting elements 20 may be mounted on one light-emitting device 100. A plurality of light-emitting elements 20 can be connected in series or in parallel.

Wires 18

The wires 18 electrically connect the electrodes of the light-emitting element 20 to the electrically-conductive members 13. Metal wires made of gold, copper, silver, platinum, aluminum, or an alloy of these metals can be used for the wires 18. Gold wires, which are less apt to be broken by stress generated by the light-transmissive member 30 and have good thermal resistance and the like, are particularly preferable for the wires 18. To enhance the light extraction efficiency, silver may constitute at least the surface of the wires 18.

Adhesive 19

The adhesive 19 is a member for fixing the light-emitting element 20 to the substrate 10 and is made of an insulating adhesive or an electrically-conductive adhesive. Examples of the insulating adhesive include epoxy resins, silicone resins, polyimide resins, and modified or hybrid resins of these resins. Examples of the electrically-conductive adhesive include electrically-conductive pastes of silver, gold, and palladium; solder such as gold tin; and brazing filler metals such as low-melting-point metals.

Light-Transmissive Member 30

As shown in FIG. 2 and FIG. 3, the light-transmissive member 30 may cover the light-emitting element 20 disposed in the depressed portion 15. The light-transmissive member 30 contains the phosphor 50, particles 40, and a matrix 31. The phosphor 50 and the particles 40 are dispersed in the matrix 31.

Matrix 31

The matrix 31 preferably contains an electrically insulating material that can transmit light emitted from the light-emitting element 20 (preferably at a transmittance of 70% or more) and is fluid before being hardened by heat. Specific examples of the material constituting the matrix 31 include silicone resins, epoxy resins, phenolic resins, polycarbonate resins, acrylic resins, polymethyl pentene resins, polynorbornene resins, and modified or hybrid resins of these resins. Among these resins, silicone resins, modified silicone resins, and hybrid silicone resins have good heat and light resistance and low volume shrinkage when being cured and are thus preferable. The light-transmissive member 30 preferably contains a filler and the like mixed in the matrix 31 but may not contain the filler.

A diffusing agent or a colorant can be used as the filler. Specific examples of the filler include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, and carbon black. Examples of the shape of the filler include spherical shapes, indefinite crushed shapes, acicular shapes, columnar shapes, plate-like shapes (including scaly shapes), fibrous shapes, and arborescent shapes. A hollow or porous filler may also be used.

Phosphor 50

A predetermined amount of the phosphor 50 is mixed in the matrix 31 of the light-transmissive member 30. The phosphor 50 absorbs at least part of primary light emitted from the light-emitting element 20 and emits secondary light that differs in wavelengths from the primary light. Specific examples of the phosphor 50 include manganese-activated barium magnesium aluminate (BAM:Mn phosphors), manganese-activated potassium fluorosilicate (KSF:Mn phosphors), europium-activated nitrogen-containing calcium aluminosilicate (such as CASN:Eu phosphors and SCASN:Eu phosphors), and europium-activated SiAlONs. This structure provides a light-emitting device 100 that emits mixed light (such as white light) of the primary light and the secondary light both having visible wavelengths.

The content of the phosphor 50 in the light-transmissive member 30 is in the range of 100 parts by mass to 300 parts by mass relative to 100 parts by mass of the matrix. If the content of the phosphor 50 falls within the above range, the particles 40 dispersed in the matrix 31 are prevented from aggregating to a diameter larger than the particle diameter that causes strongest Rayleigh scattering. Decrease in the light transmittance of the light-transmissive member 30 can also be suppressed. Accordingly, scattering inside the matrix 31 of the primary light emitted from the light-emitting element 20 is enhanced. The light extraction efficiency of the light-emitting device 100 is thus enhanced. In the case where two or more types of phosphors 50, such as a BAM:Mn phosphor 51 and a KSF:Mn phosphor 52, are used, the content of the phosphor 50 is the total content of the two or more types of phosphors 50.

If the content of the phosphor 50 is less than 100 parts by mass, the amount of the phosphor 50 dispersed in the matrix 31 is small, and the particles 40 dispersed in the matrix 31 aggregate to form aggregates 41 having diameters larger than a quarter of the wavelength of the primary light emitted from the light-emitting element 20. Consequently, the effects of Rayleigh scattering from the aggregates 41 are lessened, and improvement in the light extraction efficiency of the light-emitting device 100 cannot be expected. If the content of the phosphor 50 exceeds 300 parts by mass, a large amount of the phosphor 50 dispersed in the matrix 31 blocks the primary light emitted from the light-emitting element 20 and reduces the light transmittance of the light-transmissive member 30. Consequently, improvement in the light extraction efficiency of the light-emitting device 100 cannot be expected.

The average particle diameter of the phosphor 50 is preferably in the range of 1 μm to 50 μm. If the average particle diameter of the phosphor 50 falls within the above range, aggregation of the particles 40 dispersed in the matrix 31 and decrease in the light transmittance of the light-transmissive member 30 are suppressed, so that the light extraction efficiency of the light-emitting device 100 is improved.

If the average particle diameter of the phosphor 50 is less than 1 μm, the area occupied by the phosphor 50 in the matrix 31 is small, and the particles 40 dispersed in the matrix 31 tend to aggregate to form the aggregates 41 having diameters larger than a quarter of the wavelength of the primary light emitted from the light-emitting element 20. Consequently, the effects of Rayleigh scattering from the aggregates 41 are lessened, and improvement in the light extraction efficiency of the light-emitting device 100 cannot be expected. If the average particle diameter of the phosphor 50 exceeds 50 μm, the area occupied by the phosphor 50 in the matrix 31 is large, and the primary light emitted from the light-emitting element 20 is blocked, so that the light transmittance of the light-transmissive member 30 decreases. Consequently, improvement in the light extraction efficiency of the light-emitting device 100 cannot be expected.

The average particle diameter of the phosphor 50 can be measured by a method such as the laser diffraction/scattering method, image analysis (with a scanning electron microscope (SEM) or a transmission electron microscope (TEM)), dynamic light scattering, and small-angle X-ray scattering. The average value of the particle diameters of a plurality of particles of the phosphor 50 measured by the above method is regarded as the average particle diameter of the phosphor 50. The shape of the phosphor 50 is not particularly limited, and examples of the shapes include spherical shapes, indefinite crushed shapes, acicular shapes, columnar shapes, plate-like shapes (including scaly shapes), fibrous shapes, and arborescent shapes. The maximum particle diameter measured by the above method is regarded as the particle diameter of the phosphor 50 in the case where the phosphor 50 has a shape, such as indefinite crushed shapes and acicular shapes, other than spherical shapes.

Alternatively, the median diameter may be used instead of the average particle diameter. A median diameter is a value calculated from a mass-based or volume-based particle size distribution curve obtained by measurement of particle size distribution by, for example, the laser diffraction/scattering method. Specifically, the median diameter is calculated as the particle diameter at a cumulative mass or a cumulative volume of 50% from the small-diameter side of the particle size distribution.

Particles 40

As shown in FIG. 2 and FIG. 3, the particles 40 scatter, inside the matrix 31, the primary light emitted from the light-emitting element 20. A predetermined amount of the particles 40 having an average particle diameter in a predetermined range is contained in the light-transmissive member 30. The particles 40 have an average particle diameter in the range of 1 nm to 8 nm and are at least one of surface-treated particles 40, particles 40 coexisting with a dispersing agent, and surface-treated particles 40 coexisting with a dispersing agent. The particles 40 are dispersed in the matrix 31 of the light-transmissive member 30 in the form of the aggregates 41 formed by aggregation of the particles 40. The content of the particles 40 in the light-transmissive member 30 is in the range of 0.01 parts by mass to less than 5 parts by mass relative to 100 parts by mass of the matrix.

If the average particle diameter and content of the particles 40 are as described above and if the particles 40 are at least one of the surface-treated particles 40, the particles 40 coexisting with a dispersing agent, and the surface-treated particles 40 coexisting with a dispersing agent, unlimited aggregation of the particles 40 is prevented, and the average particle diameter of the aggregates 41 becomes about one-tenth, at which Rayleigh scattering is strongest, of the wavelength of the primary light emitted from the light-emitting element 20 almost without exceeding a quarter of the wavelength. Specifically, the average particle diameter of the aggregates 41 is preferably in the range of 10 nm to 80 nm. If the aggregates 41 has an average particle diameter of about one-tenth of the wavelength of the primary light emitted from the light-emitting element 20, Rayleigh scattering from the aggregates 41 increases the amount of scattered primary light of the light-emitting element 20, thereby improving the light extraction efficiency of the light-emitting device 100. Also, Rayleigh scattering leads to excitation of the phosphor 50 and ensures sufficient secondary light emitted from the phosphor 50. Accordingly, the content of the phosphor 50 in the light-transmissive member 30 can be reduced compared with conventional contents, so that the light transmittance of the light-transmissive member 30 is improved. The light extraction efficiency of the light-emitting device 100 is thus enhanced, and the cost of the light-emitting device 100 can be reduced.

If the particles 40 have an average particle diameter less than 1 nm, which is too small, the aggregates 41 formed by aggregation of the particles 40 have an average particle diameter less than 10 nm. Rayleigh scattering from the aggregates 41 is thus reduced, and increase in the amount of scattered primary light of the light-emitting element 20 cannot be expected. If the particles 40 have an average particle diameter larger than 8 nm, which is too large, the aggregates 41 formed by aggregation of the particles 40 have an average particle diameter larger than 80 nm. The aggregates 41 thus block the primary light emitted from the light-emitting element 20, and increase in the amount of scattered primary light of the light-emitting element 20 cannot be expected.

The aggregates 41 are larger than the particles 40 and are easily observed. Hence, the existence of the particles 40 can be inferred from observation of the existence of the aggregates 41. The average particle diameter of the particles 40 or the aggregates 41 can be measured by a method such as the laser diffraction/scattering method, image analysis (with a scanning electron microscope (SEM) or a transmission electron microscope (TEM)), dynamic light scattering, and small-angle X-ray scattering. The average value of the particle diameters of a plurality of particles 40 or aggregates 41 measured by the above method is regarded as the average particle diameter of the particles 40 or the aggregates 41. Alternatively, the median diameter described above may be used instead of the average particle diameter.

The shape of the particles 40 or the aggregates 41 is not particularly limited and may be an indefinite crushed shape, but a spherical shape is preferable because such a shape minimizes contact between the particles 40 or between the aggregates 41 and suppresses aggregation. Also, plate-shaped particles 40 or aggregates 41 can impart gas barrier properties to the light-transmissive member 30. The maximum particle diameters measured by the above method are regarded as the particle diameters of the particles 40 or the aggregates 41 in the case where the particles 40 or the aggregates 41 have a shape, such as indefinite crushed shapes and plate-like shapes, other than spherical shapes.

If the content of the particles 40 is less than 0.01 parts by mass, only a small amount of the particles 40 aggregates, and many of the aggregates 41 formed by aggregation of the particles 40 have a size less than 10 nm. Rayleigh scattering from the aggregates 41 is thus reduced, and increase in the amount of scattered primary light of the light-emitting element 20 cannot be expected. If the content of the particles 40 is 5 parts by mass or more, a large amount of the particles 40 aggregates, and many of the aggregates 41 formed by aggregation of the particles 40 have sizes larger than 80 nm. The aggregates 41 thus block the primary light emitted from the light-emitting element 20, and increase in the amount of scattered primary light of the light-emitting element 20 cannot be expected.

The material for the particles 40 is not particularly limited and may be an organic or inorganic substance. A light-transmissive substance is preferably used for the particles 40 in view of the light extraction efficiency of the light-emitting device. The particles 40 preferably have a melting point of 260° C. or higher in view of solder heat resistance.

Specific preferable examples of the organic substance used for the particles 40 include resins such as polymethacrylate esters and their copolymers, polyacrylate esters and their copolymers, cross-linked polymethacrylate esters, cross-linked polyacrylate esters, polystyrene and its copolymers, cross-linked polystyrene, epoxy resins, silicone resins, and amorphous fluorocarbon resins. Core-shell particles 40 produced by coating inorganic particles with at least one selected from the above resins are also included. Since the refractive index of such organic particles 40 can be adjusted to the refractive index of the matrix 31 of the light-transmissive member by copolymerization, the particles 40 have little optical effect. For example, the particles 40 maintain the light-transmissive property.

Preferable examples of the inorganic substance used for the particles 40 include oxides such as silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, and tin oxide. Such inorganic particles 40 have good heat and light resistance and have comparatively high thermal conductivity. Among these substances, silicon oxide, aluminum oxide, zirconium oxide, and titanium oxide are easily available and comparatively inexpensive.

The particles 40 are at least one of the surface-treated particles 40, the particles 40 coexisting with a dispersing agent, and the surface-treated particles 40 coexisting with a dispersing agent. The surface treatment of the particles 40 is performed by chemically bonding a surface treatment agent to the surface of the particles 40. Examples of the surface treatment agent include long-chain aliphatic amines and their derivatives; long-chain aliphatic fatty acids and their derivatives; silane couplers; siloxane compounds containing the amine group and/or the carboxy group; siloxane compounds containing at least one selected from the silanol group, the hydrogen silane group, and the alcohol group; siloxane compounds containing the vinylsilyl group and at least one selected from the silanol group, the alkoxy group, and the hydrogen silane group; monoglycidyl ether terminated siloxane compounds; monohydroxy ether terminated siloxane compounds; organic silazane compounds; organic titanate compounds; isocyanate compounds; epoxy compounds; and phosphate compounds.

Examples of the dispersing agent coexisting with the particles 40 or the surface-treated particles 40 include, in addition to the above surface treatment agents, macromolecular compounds containing an acidic or basic group, fluorine-containing surfactants, polyol compounds, polyethylene oxide derivatives, polypropylene oxide derivatives, polyunsaturated fatty acid derivatives, silane coupler hydrolysates, and quaternary ammonium salt compounds. As described later in the section on a method for manufacturing the light-emitting device, the particles 40 coexisting with a dispersing agent are obtained by adding the dispersing agent to a slurry containing the phosphor 50, the particles 40, and the matrix 31, and examples thereof include particles 40 that have adsorbed the dispersing agent.

The method for manufacturing the light-emitting device includes mounting a light-emitting element and forming a light-transmissive member. The following describes each step. The structure of the light-emitting device is described referring to FIG. 1 to FIG. 3.

Mounting Light-Emitting Element

In the mounting of the light-emitting element, the light-emitting element 20 is mounted in the depressed portion 15 of the substrate 10. First, the substrate 10 and the light-emitting element 20 are provided by conventionally known manufacturing methods. Subsequently, the light-emitting element 20 is mounted in the depressed portion 15 as described below.

In the case of a light-emitting element 20 having a pair of positive and negative electrodes on the same surface, the light-emitting element 20 is face-up mounted in the depressed portion 15 of the substrate 10 such that the pair of positive and negative electrodes on the upper surface are connected to the electrically-conductive members 13 with the wires 18 as shown in FIG. 1 and FIG. 2, or the light-emitting element 20 is face-down (flip-chip) mounted in the depressed portion 15 of the substrate 10 such that a pair of positive and negative electrodes, which are not shown, on the lower surface are connected to the electrically-conductive members 13 via the adhesive 19, specifically an electrically-conductive adhesive. In the case of face-up mounting, the lower surface of the light-emitting element 20 is connected to the electrically-conductive members 13 via the adhesive 19, specifically an electrically-conductive adhesive or an insulating adhesive.

In the case of a light-emitting element 20, which is not shown, having a pair of positive and negative electrodes on opposite surfaces, the light-emitting element 20 is mounted in the depressed portion 15 of the substrate 10 by bonding the electrode on the lower surface to an electrically-conductive member 13 via an electrically-conductive adhesive and connecting the electrode on the upper surface to another electrically-conductive member 13 with a wire 18.

Forming Light-Transmissive Member

In the forming of the light-transmissive member 30, the light-transmissive member 30 is formed in the depressed portion 15 of the substrate 10 to cover the light-emitting element 20.

First, a slurry containing the phosphor 50 and the particles 40 dispersed in the matrix 31 is provided. The slurry is prepared such that the content of the phosphor 50 falls within the range of 100 parts by mass to 300 parts by mass relative to 100 parts by mass of the matrix. The slurry is prepared such that the content of the particles 40 falls within the range of 0.01 parts by mass to less than 5 parts by mass relative to 100 parts by mass of the matrix. Particles having an average particle diameter in the range of 1 nm to 8 nm surface-treated with the surface treatment agent in advance are used as the particles 40. Instead of the surface-treated particles 40, the particles 40 coexisting with a dispersing agent or the surface-treated particles 40 coexisting with a dispersing agent may be used. The particles 40 coexisting with a dispersing agent or the surface-treated particles 40 coexisting with a dispersing agent are, for example, particles that have adsorbed the dispersing agent obtained by adding the dispersing agent to the slurry.

Subsequently, the slurry is stirred with a centrifugal stirrer to disperse the particles 40 in the form of aggregates. The slurry is charged into the depressed portion 15 to cover the light-emitting element 20 by an application method such as spraying, screen printing, and potting (dripping). The slurry is then hardened by heat, so that the light-transmissive member 30 is formed in the depressed portion 15 to provide the light-emitting device 100. Although depending on the material for the matrix 31, the heat is applied preferably to a temperature of 100° C. to 300° C.

By the above method for manufacturing the light-emitting device 100, the light-emitting device 100 in which the average particle diameter of the aggregates 41 in the light-transmissive member 30 is about one-tenth of the wavelength of the primary light emitted from the light-emitting element 20, specifically in the range of 10 nm to 80 nm, is manufactured. Accordingly, the amount of scattered primary light is improved by Rayleigh scattering from the aggregates 41, so that the light-emitting device 100 that shows improved light extraction efficiency is manufactured.

EXAMPLES

The following describes examples and comparative examples according to the present invention in detail. Needless to say, the present invention is not limited to the following examples only.

Example 1

A light-emitting device in Example 1 is a top-view SMD LED having the structure of the illustrative light-emitting device 100 shown in FIG. 1 and FIG. 2.

The substrate 10 is a package having a rectangular-cuboid shape measuring 3.0 mm in height, 3.0 mm in width, and 0.52 mm in thickness. The package is produced by forming the formed body 14 on a pair of positive and negative (first and second) electrically-conductive members 13 in an integrated manner. The substrate 10 is produced by disposing a processed metal plate (lead frame) including a plurality of pairs of electrically-conductive members 13 connected to each other in the longitudinal and lateral directions via suspension leads in a mold, injecting and hardening liquid components of the formed body 14, releasing the product, and cutting (separating) the product. In the present example, the substrate 10 is cut after forming the light-transmissive member 30 encapsulating the light-emitting element 20.

Each of the first and second electrically-conductive members 13 is a plate-shaped copper-alloy piece having a maximum thickness of 0.2 mm plated with silver. Exposed regions of the lower surfaces of the first and second electrically-conductive members 13 are substantially flush with the lower surface of the formed body 14 and constitute the lower surface of the substrate 10. Although not shown in the drawings, portions (suspension lead portions that have been cut) of each of the first and second electrically-conductive members 13 are exposed on lateral end surfaces of the substrate 10. On the exposed portions, depressions that function as castellations are formed.

The formed body 14 has a square outer shape measuring 3.0 mm in height and 3.0 mm in width in a top view, has a maximum thickness of 0.52 mm, and is made of epoxy resin mixed with titanium oxide. The depressed portion 15 having a circular shape in a top view measuring 2.48 mm in diameter and 0.32 mm in depth is formed at a substantial center of the upper surface of the formed body 14, that is, the upper surface of the substrate 10. The inclination angle of the lateral walls of the depressed portion 15 is 95° from the bottom surface of the depressed portion.

The upper surfaces of the first and second electrically-conductive members 13 constitute part of the bottom surface of the depressed portion. One light-emitting element 20 is bonded to the upper surface of the first electrically-conductive member 13 with a silicone resin adhesive 19. The light-emitting element 20 is an LED element that includes a nitride-semiconductor element structure layered on a sapphire substrate, can emit blue (with a center wavelength of about 460 nm) light, and measures 650 µm in height, 650 µm in width, and 120 µm in thickness. One of p- and n-electrodes of the light-emitting element 20 is connected to the upper surface of the first electrically-conductive member 13 with a wire 18, and the other one of the p- and n-electrodes is connected to the upper surface of the second electrically-conductive member 13 with a wire 18. The wires 18 are gold wires having a diameter of 25 µm.

A slurry was dripped from a dispenser into the depressed portion 15 of the substrate 10. The slurry was hardened by heat, so that the light-transmissive member 30 was formed to cover the light-emitting element 20 to provide the light-emitting device 100.

The slurry contained a silicone resin matrix 31, BAM:Mn phosphor 51, KSF:Mn phosphor 52, and zirconia nanoparticles.

The contained BAM:Mn phosphor 51 had an average particle diameter of 16.2 µm, and its content was 179.8 parts by mass relative to 100 parts by mass of the matrix 31. The contained KSF:Mn phosphor 52 had an average particle diameter of 26.4 µm, and its content was 15.6 parts by mass relative to 100 parts by mass of the matrix 31.

The contained zirconia nanoparticles were zirconium oxide particles having an average particle diameter of 5 nm surface-treated with a siloxane compound, and its content was 0.1 parts by mass relative to 100 parts by mass of the matrix 31.

Example 2

A light-emitting device 100 was produced in substantially the same manner as Example 1 except that the content of the zirconia nanoparticles having an average particle diameter of 5 nm was changed to 0.5 parts by mass.

Example 3

A light-emitting device 100 was produced in substantially the same manner as Example 1 except that the content of the zirconia nanoparticles added having an average particle diameter of 5 nm was changed to 1 part by mass.

Comparative Example 1

A light-emitting device 100 was produced in substantially the same manner as Example 1 except that the content of the zirconia nanoparticles having an average particle diameter of 5 nm was changed to 5 parts by mass.

Comparative Example 2

A light-emitting device 100 was produced in substantially the same manner as Example 1 except that the content of the zirconia nanoparticles having an average particle diameter of 5 nm was changed to 10 parts by mass.

Comparative Example 3

A light-emitting device 100 was produced in substantially the same manner as Example 1 except that 0.1 parts by mass of zirconia nanoparticles having an average particle diameter of 10 nm was contained.

Comparative Example 4

A light-emitting device 100 was produced in substantially the same manner as Example 1 except that 1 part by mass of zirconia nanoparticles having an average particle diameter of 10 nm was contained.

Comparative Example 5

A light-emitting device 100 was produced in substantially the same manner as Example 1 except that 10 parts by mass of zirconia nanoparticles having an average particle diameter of 10 nm was contained.

Comparative Example 6

A light-emitting device 100 was produced in substantially the same manner as Example 1 except that 0.1 parts by mass of zirconia nanoparticles having an average particle diameter of 40 nm was contained.

Comparative Example 7

A light-emitting device 100 was produced in substantially the same manner as Example 1 except that 1 part by mass of zirconia nanoparticles having an average particle diameter of 40 nm was contained.

Comparative Example 8

A light-emitting device 100 was produced in substantially the same manner as Example 1 except that 10 parts by mass of zirconia nanoparticles having an average particle diameter of 40 nm was contained.

Comparative Example 9

A light-emitting device 100 was produced in substantially the same manner as Example 1 except that no zirconia nanoparticles were contained.

Luminous fluxes of the light-emitting devices 100 produced were measured with an integrating sphere. Table 1 shows the results in terms of luminous flux ratios. A luminous flux ratio is a ratio of the luminous flux value in each example to the luminous flux value, which is regarded as 100, in Comparative Example 9. FIG. 4 shows the relation between the luminous flux ratios of the light-emitting devices 100 and the average particle diameter and content of zirconia nanoparticles.

TABLE 1

| Sample No. | | Particles | | Luminous flux ratio (%) |
|---|---|---|---|---|
| | | Average particle diameter (nm) | Content (part by mass) | |
| Example | 1 | 5 | 0.1 | 100.8 |
| | 2 | 5 | 0.5 | 100.8 |
| | 3 | 5 | 1 | 100.7 |
| Comparative example | 1 | 5 | 5 | 99.2 |
| | 2 | 5 | 10 | 99.8 |
| | 3 | 10 | 0.1 | 99.9 |
| | 4 | 10 | 1 | 98.1 |
| | 5 | 10 | 10 | 94.1 |
| | 6 | 40 | 0.1 | 99.6 |
| | 7 | 40 | 1 | 99.4 |
| | 8 | 40 | 10 | 95.2 |
| | 9 | — | — | 100 |

(Note)
The symbol "—" in the table indicates that particles are not contained.

As shown in Table 1 and FIG. 4, since the average particle diameters and contents of the zirconia nanoparticles in the light-emitting devices 100 in Examples 1 to 3 met the requirements of the present invention, the zirconia nanoparticles aggregated to form aggregates 41 having an average particle diameter of about one-tenth of the wavelength of blue light emitted from the light-emitting element 20. Consequently, the effects of Rayleigh scattering from the aggregates 41 were enhanced, and the luminous flux ratio, that is, the light extraction efficiency, was improved.

On the other hand, since the contents of the zirconia nanoparticles were large in the light-emitting devices 100 in Comparative Examples 1 and 2, the zirconia nanoparticles aggregated to form aggregates 41 having an average particle diameter larger than a quarter of the wavelength of blue light. Consequently, the effects of Rayleigh scattering from the aggregates 41 were lessened, and the luminous flux ratio, that is, the light extraction efficiency, decreased.

Since the average particle diameters of the zirconia nanoparticles were large in the light-emitting devices 100 in Comparative Examples 3, 4, 6, and 7, the zirconia nanoparticles aggregated to form aggregates 41 having an average particle diameter larger than a quarter of the wavelength of blue light. Consequently, the effects of Rayleigh scattering from the aggregates 41 were lessened, and the luminous flux ratio, that is, the light extraction efficiency, decreased.

Since the average particle diameters and contents of the zirconia nanoparticles were large in the light-emitting devices 100 in Comparative Examples 5 and 8, the zirconia nanoparticles aggregated to form aggregates 41 having an average particle diameter larger than a quarter of the wavelength of blue light. Consequently, the effects of Rayleigh scattering from the aggregates 41 were lessened, and the luminous flux ratio, that is, the light extraction efficiency, decreased.

Since the light-emitting device 100 in Comparative Example 9 did not contain zirconia nanoparticles, Rayleigh scattering from zirconia nanoparticles is not caused. Accordingly, the luminous flux ratio, that is, the light extraction efficiency decreased compared with Examples 1 to 3.

INDUSTRIAL APPLICABILITY

The light-emitting devices according to the present disclosure can be used for light sources for backlights of liquid-crystal displays, a variety of lighting apparatuses, large format displays, and various displays for advertisements or destination guide, as well as digital video cameras, image scanners in apparatuses such as facsimile machines, copying machines, and scanners, projectors, and other apparatuses.

The invention claimed is:
1. A light-emitting device comprising:
a light-emitting element; and
a light-transmissive member covering the light-emitting element, the light-transmissive member comprising:
a phosphor;
particles; and
a matrix,
wherein the phosphor and the particles are dispersed in the matrix,
wherein the particles comprise at least one of surface-treated particles, particles coexisting with a dispersing agent, and surface-treated particles coexisting with a dispersing agent,
wherein the particles are dispersed as aggregates,
wherein the particles have an average particle diameter in a range of 1 nm to 8 nm,
wherein a content of the particles falls within a range of 0.01 parts by mass to less than 5 parts by mass relative to 100 parts by mass of the matrix, and
wherein a content of the phosphor falls within a range of 100 parts by mass to 300 parts by mass relative to 100 parts by mass of the matrix.
2. The light-emitting device according to claim 1, wherein the particles comprise zirconium oxide.
3. The light-emitting device according to claim 1, wherein the phosphor comprises manganese-activated barium magnesium aluminate and manganese-activated potassium fluorosilicate.
4. The light-emitting device according to claim 1, wherein the matrix comprises a silicone resin, a modified silicone resin, or a hybrid silicone resin.
5. The light-emitting device according to claim 1,
wherein the light-emitting element has an emission peak in a range of 400 nm to 480 nm, and
wherein the aggregates have an average particle diameter of 10 nm to 80 nm.
6. A method for manufacturing a light-emitting device, the method comprising:
mounting a light-emitting element in a depressed portion of a substrate; and
forming a light-transmissive member in the depressed portion to cover the light-emitting element, the light-transmissive member comprising:
a phosphor;
at least one of surface-treated particles, particles coexisting with a dispersing agent, and surface-treated particles coexisting with a dispersing agent; and
a matrix,
wherein the phosphor and the particles are dispersed in the matrix,
wherein the particles are dispersed as aggregates,
wherein the particles have an average particle diameter in a range of 1 nm to 8 nm,
wherein a content of the particles falls within a range of 0.01 parts by mass to less than 5 parts by mass relative to 100 parts by mass of the matrix, and wherein a content of the phosphor falls within a range of 100 parts by mass to 300 parts by mass relative to 100 parts by mass of the matrix in the forming of the light-transmissive member.

* * * * *